United States Patent [19]

Sakai

[11] Patent Number: 5,082,615
[45] Date of Patent: Jan. 21, 1992

[54] METHOD FOR PACKAGING SEMICONDUCTOR DEVICES IN A RESIN

[75] Inventor: Kunito Sakai, Hyogo, Japan

[73] Assignee: Mitsubishi Denki Kabushiki Kaisha, Tokyo, Japan

[21] Appl. No.: 404,389

[22] Filed: Sep. 8, 1989

Related U.S. Application Data

[62] Division of Ser. No. 135,092, Dec. 18, 1987, abandoned.

[51] Int. Cl.$^5$ .................. B29C 45/02; B29C 45/14
[52] U.S. Cl. .................. 264/510; 264/571; 264/102; 264/272.14; 264/272.17
[58] Field of Search .......... 425/546, 584, DIG. 60, 425/420, 812; 264/272.17, 510, 571, 102, 101, 272.14; 249/141, 113

[56] References Cited

U.S. PATENT DOCUMENTS

| | | | |
|---|---|---|---|
| 4,123,215 | 10/1978 | Madenokoji | 425/388 |
| 4,314,955 | 2/1982 | Boden et al. | 264/51 |
| 4,412,804 | 11/1983 | Huther | 425/546 |
| 4,482,515 | 11/1984 | Buhler | 264/102 |
| 4,714,423 | 12/1987 | Hattori et al. | 425/376 R |

FOREIGN PATENT DOCUMENTS

| | | |
|---|---|---|
| 54-153866 | 12/1979 | Japan . |
| 58-68940 | 4/1983 | Japan . |
| 58-241323 | 12/1983 | Japan . |
| 59-93315 | 5/1984 | Japan . |
| 59-139633 | 8/1984 | Japan . |
| 60-127112 | 7/1985 | Japan . |
| 60-132716 | 7/1985 | Japan . |
| 61-118218 | 6/1986 | Japan . |
| 6274613 | 4/1987 | Japan . |
| 62-098733 | 5/1987 | Japan . |
| 62-282440 | 12/1987 | Japan . |
| 2190467 | 11/1987 | United Kingdom . |

*Primary Examiner*—Jan H. Silbaugh
*Assistant Examiner*—Angela Ortiz
*Attorney, Agent, or Firm*—Lowe, Price, Leblanc & Becker

[57] ABSTRACT

A method for packaging semiconductor devices in resin uses a mold having a pot and cavities, a vacuum pump for drawing off the air contained in the pot and the gases emitted from a resin tablet placed in the pot, and a pressing piston for pressing the resin tablet to feed the resin to the cavities. The pot has a volume which is greater than the maximum volume to which the heated resin tablet expands in a vacuum. The method includes the steps of placing the resin tablet in the pot, heating the resin under an applied vacuum until it expands to a sufficient extent to draw away gas trapped in the heated resin tablet, pressing the heated resin to the cavities to surround semiconductor devices placed therein, and curing the resin.

12 Claims, 7 Drawing Sheets

METHOD FOR PACKAGING SEMICONDUCTOR DEVICES IN A RESIN

This application is a division of application Ser. No. 07/135,092 filed Dec. 18, 1987, now abandoned.

BACKGROUND OF THE INVENTION

1. Field of the Invention

This invention relates to an apparatus and method for packaging semiconductor devices such as semiconductor integrated circuits in resin to protect them from their surroundings.

2. Description of the Prior Art

FIGS. 1 and 2 are sectional views diagrammatically showing a mold used in a transfer molding machine for resin-sealed semiconductor devices which is disclosed for example in Japanese Patent Application Laying-Open No. 68940/1983. A mold 1 attached to a hydraulic press comprises an upper mold section 2 and a lower mold section 3, which are separable from each other. The mold 1 is heated to 180° C. by suitable heating means. Formed in the region of contact between the upper and lower mold sections 2 and 3 are a pot 4 for receiving a resin tablet 7, a plurality of cavities 6 communicating with said pot 4 through runners 5, and an exhaust port 12. Each cavity receives a semiconductor device such as a semiconductor integrated circuit.

To compress the resin tablet 7 disposed in the pot 4, there are provided a piston 8 and a hydraulic cylinder 9 which drives said piston 8. A seal member 10 is disposed around the outer periphery of the piston so that gas tightness can be maintained while the piston 8 is slid along the inner wall surface of the pot 4. A seal member is disposed in the region of contact between the upper and lower mold sections 2 and 3 to maintain gas tightness therebetween.

As shown in the figures, a vacuum pump 13 is provided for drawing off the air contained in the pot 4 and cavities 6. The resin tablet is formed of an epoxy resin powder compressed into a cylindrical form, the softening point thereof being 80°-100° C.

Referring to FIGS. 1 and 2, the known operation or steps involved in packaging semiconductor devices in resin will now be described.

First, the mold 1 comprising the upper and lower mold sections 2 and 3 is attached to the hydraulic press, and the mold 1 is heated to 170°-180° C. Thereafter, the upper and lower mold sections 2 and 3 are separated from each other, and semiconductor devices are put in the cavities 6. Further, the resin tablet 7, heated to 80°-100° C. in advance, is put in the pot 4. The upper and lower mold sections 2 and 3 are then clamped together.

The vacuum pump 13 is then operated to draw off the air contained in the pot 4 and cavities 6. After the pot 4 and cavities 6 have been substantially evacuated, the piston 8 is lifted to compress the resin tablet 7. The resin tablet 7 has had its temperature raised due to heat conduction from the mold 1 and its viscosity is consequently lowered. The resin tablet 7 is pressed by the piston 8, with the result that the resin is fed to the cavities 6 through the runners 5. Therefore, the semiconductor device disposed in each cavity 6 is entirely enclosed in resin. The resin will be cured in 2-3 minutes. Thereafter, the mold 1 is opened to take out the moldings. Necessary treatments are applied to the moldings thus taken out whereby the products are completed.

However, the conventional apparatus shown in FIGS. 1 and 2 and the method described above entail the following problems.

Heretofore, in consideration of the efficiency of use of resin, the inner diameter of the pot 4 has been made close to the outer diameter of the resin tablet 7. In other words, the ratio of the inner diameter of the pot 4 to the outer diameter of the resin tablet 7 is about 1:1. The resin tablet 7 contains air, moisture, low-boiling organic substances and the like. As a result, when a vacuum is created in the pot 4 by the vacuum pump 13, such gases as air in the resin tablet 7 expand and the resin tablet 7 expands radially. Since the inner diameter of the pot 4 is approximately equal to the outer diameter of the resin tablet 7, as described above, the radial expansion of the resin tablet 7 causes the resin tablet 7 to intimately contact the inner wall surface of the pot 4. As a result, the air between said intimately contacted region and the piston 8 is confined as it is cut off from escape.

If the evacuating operation by the vacuum pump 13 is continued in this condition, the resin tablet 7 is pulled up in its entirety until it abuts against the upper mold section 2, as shown in FIG. 2, with part of the resin flowing into the runners 5. When the runners 5 are thus blocked by the resin, it is no longer possible to draw off the air contained in the pot 4, nor is it possible to extract the air contained in the resin tablet 7 even if the vacuum pump 13 is operated. After all, with the apparatus shown in FIGS. 1 and 2, it follows that with much air remaining in the pot 4 and in the resin tablet 7, a portion of the air remains mixed in the resin as the piston 8 is operated to press the resin tablet 7. Therefore, a large amount of air is trapped in each of the semiconductor devices molded in the cavities 6, leading to a decrease in the reliability of the semiconductor devices.

More particularly, the marks of gas bubbles in the form of recesses remain on the surfaces of the moldings, leading to a poor appearance and lead wire breaks. Further, if such molding having a semiconductor device molded therein is placed in a wet environment, moisture which penetrates into the molding dissolves the low-boiling organic substances remaining therein, so that the penetrating water itself turns acidic or alkaline. As a result, this causes the problem of the penetrating water corroding the aluminum wiring formed on the chip of the semiconductor device.

SUMMARY OF THE INVENTION

An object of the invention is to provide an apparatus and method for obtaining a resin-molded device which does not allow air, moisture, and low-boiling substances to remain therein.

An apparatus according to the invention comprises: a mold which has a pot for receiving a resin tablet therein and a plurality of cavities communicating with said pot through runners for receiving semiconductor devices therein; vacuum means for drawing off the air contained in the pot and the gases emitted from the resin tablet put in said pot; and pressing means for pressing the resin tablet by reducing the volume of the pot to feed the resin to the cavities via the runners. The pot has a volume which is greater than the maximum volume to which the heated resin tablet expands in a vacuum.

A method according to the invention, used to package semiconductor devices in resin by using a mold which has a pot and a plurality of cavities communicating with said pot through runners, comprises the steps of placing semiconductor devices in the cavities, placing a resin tablet in the pot, which has a greater volume than the maximum volume to which the heated resin tablet expands in a vacuum, drawing off the air contained in the pot and the gases emitted from the resin tablet placed in the pot, pressing the resin tablet in the pot to feed the resin to the cavities via the runners, and allowing the resin moldings each having a semiconductor device enclosed therein to be cured.

The gases in the resin tablet expand owing to the vacuum operation by the vacuum means and so does the resin tablet. Since the pot has a volume which is greater than the maximum volume to which the heated resin tablet expands in a vacuum, the air in the pot is efficiently drawn off and so are the gases in the resin tablet. When the evacuating operation is completed, no air remains in the pot and no gases in the resin tablet. Therefore, the moldings finally obtained contain no gas bubbles; thus resin-molded semiconductor devices which are superior in moisture resistance and heat resistance can be obtained.

When the evacuating operation is performed by the vacuum means, the resin tablet will expand to about twice its initial volume. Thus, in a preferred embodiment of the invention, the pot has a volume which is more than twice as large as the volume of the resin tablet Further, when the evacuating operation by the vacuum means is performed, the resin tablet expands until its outer diameter is about 1.17 times as large as its initial value. Thus, in a preferred embodiment of the invention, the pot has an inner diameter which is more than 1.17 times as large as the outer diameter of the resin tablet in order to increase the efficiency of use of resin and to make it possible to sufficiently draw off the air contained in the pot and in the resin.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
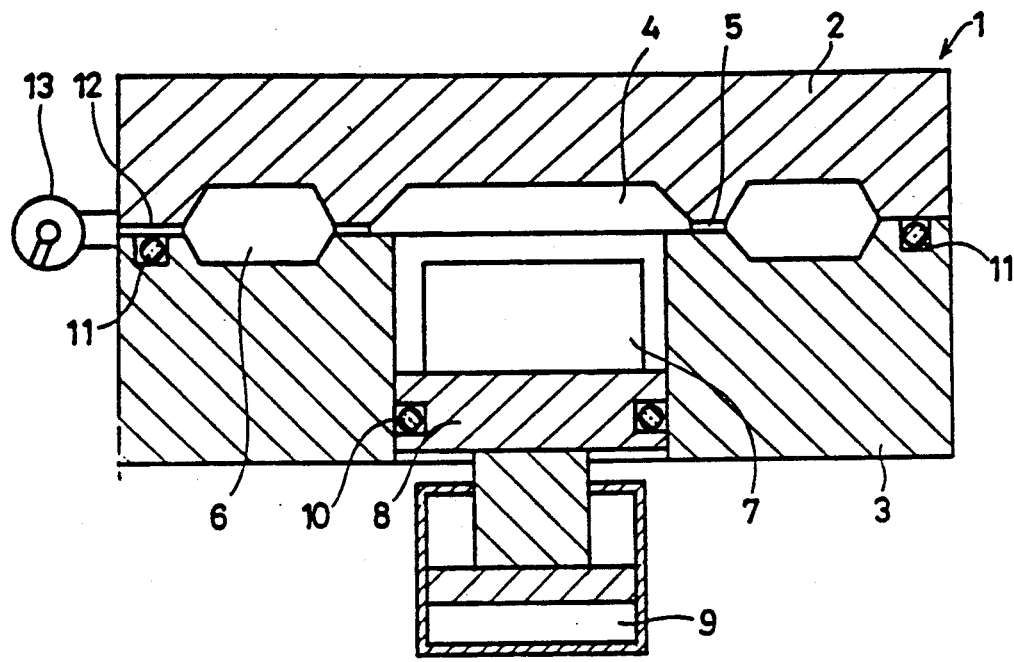
FIG. 1 is a diagrammatic sectional view of a conventional packaging apparatus.
Figure 2:
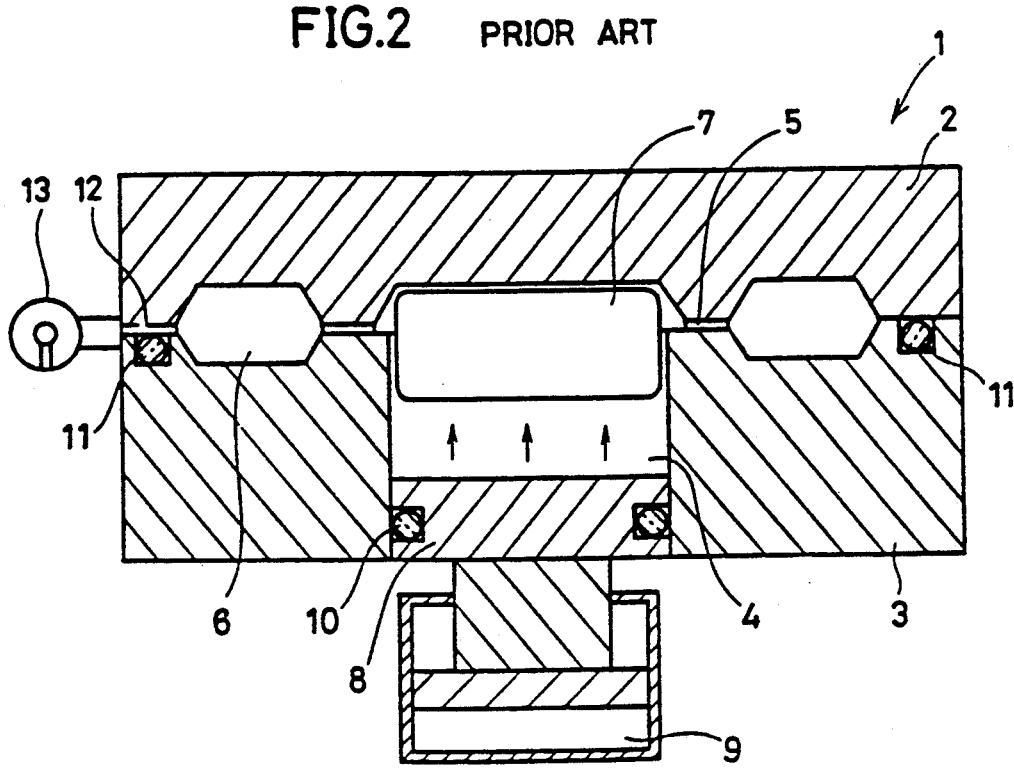
FIG. 2 is a diagrammatic sectional view showing an evacuating operation on the known apparatus of FIG. 1.
Figure 3:
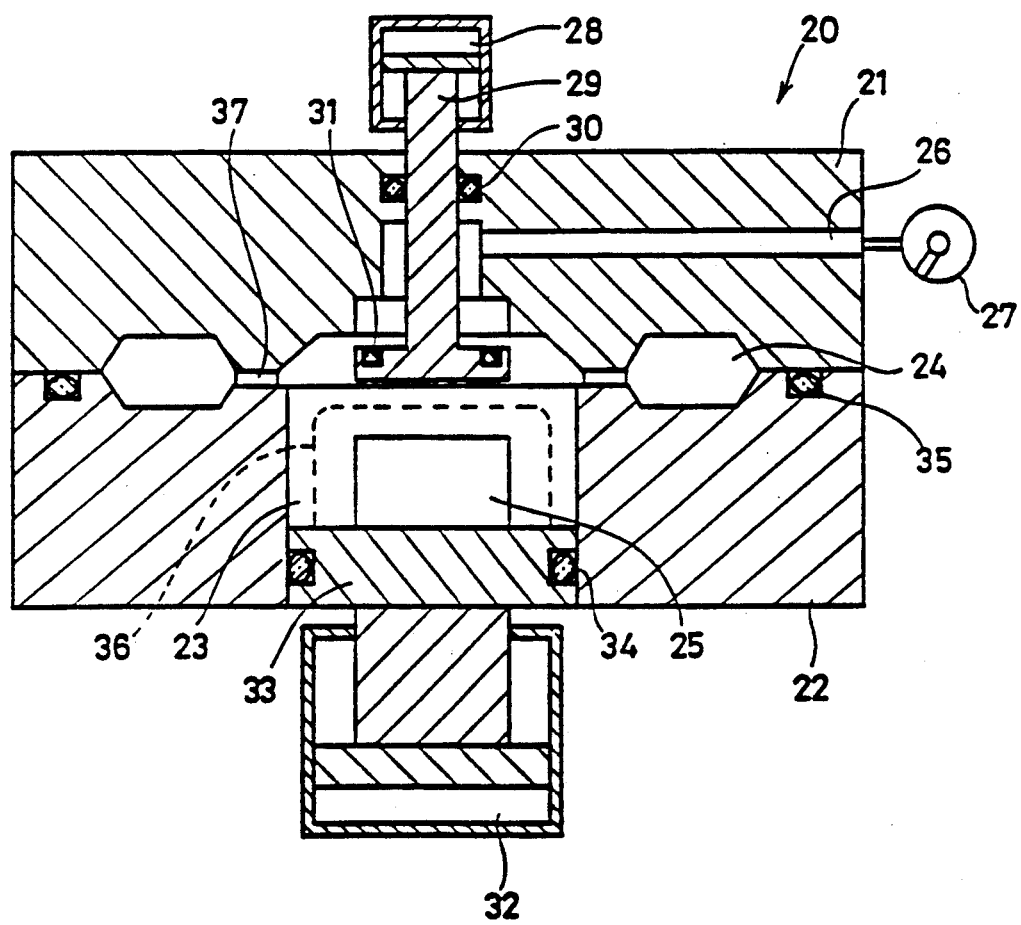
FIG. 3 is a diagrammatic sectional view showing an embodiment of an apparatus according to a preferred embodiment of the invention.
Figure 4:
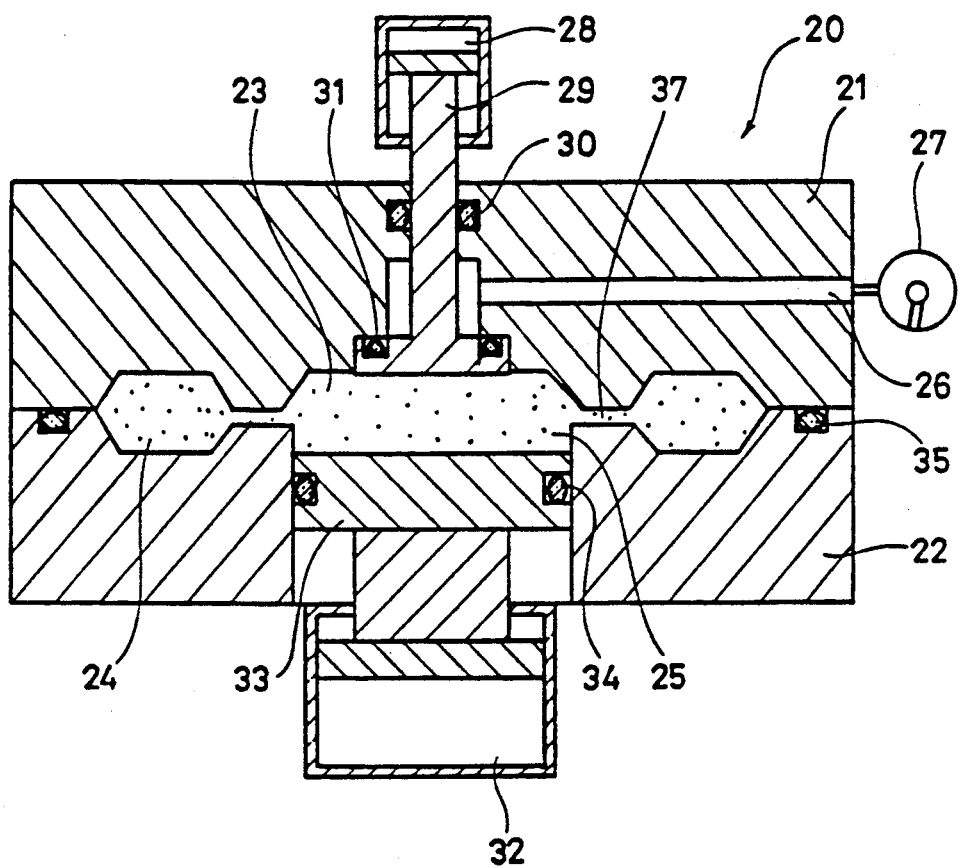
FIG. 4 is a diagrammatic view showing a state established by operating a piston from the state shown in FIG. 3.

FIGS. 3 and 4 illustrate a preferred embodiment of the invention. The illustrated apparatus comprises a mold 20, vacuum means 27 and pressing means 32, 33. The mold 20 has an upper mold section 21 and a lower mold section 22 which are separable from each other. Formed in the region of contact between the upper and lower mold sections 21 and 22 are a pot 23 for receiving a resin tablet 25, and a plurality of cavities 24 communicating with pot 23 through runners 37 for receiving semiconductor devices therein. The pot 23 communicates with an exhaust port 26 formed in the upper mold section 21. The vacuum means 27 may be, for example, a vacuum pump for drawing off the air contained in the pot 23 and the gases emitted from the resin tablet 25 placed in the pot 23.

The upper mold section 21 is formed with an exhaust valve 29 for opening and closing the exhaust port 26. This exhaust valve 29 is operated by an air cylinder 28. FIG. 3 shows the opened state of the exhaust valve 20 and FIG. 4 shows the closed state of the exhaust valve 29. As shown, seal members 30 and 31 are disposed in the region of contact between the exhaust valve 29 and the upper mold section 21. These seal members 30 and 31 maintain gas tightness between the exhaust valve 29 and the upper mold section 21.

The pressing means for pressing the resin tablet 25 by reducing the volume of the pot 23 to feed the resin to the cavities 24 via the runners 37 comprises a hydraulic cylinder 32 and a piston 33. A seal member 34 is disposed between the piston 33 and the lower mold section 22. The piston 33 is driven by the hydraulic cylinder 32 and is slidable along the inner wall surface of the pot 23 with gas tightness maintained.

The resin tablet 25 is a cylindrically compressed form of a powder of epoxy resin or the like, the softening point thereof being 80°-100° C. In this embodiment, the resin tablet 25 is 30 mm in diameter and 40 mm in height.

The pot 23 has a volume which is greater than the maximum volume to which the heated resin tablet 25 expands in a vacuum. In FIG. 3, a dotted line 36 indicates the shape of the resin tablet 25 when the latter expands to a maximum. In this embodiment, the pot 23 has an inner diameter which is 1.17 times as large as the outer diameter of the resin tablet 25. Further, the volume of the pot 23 is about 1.7 times as large as that of the resin tablet 25. More particularly, the pot 23 has an inner diameter of 35 mm and a height of 50 mm.

The operation and steps up to packaging semiconductor devices in resin by using the apparatus shown in FIGS. 3 and 4 will now be described.

First, the mold 20 is attached to the hydraulic press and then heated to 180° C. by suitable heating means. Thereafter, the upper and lower mold sections 21 and 22 are vertically separated from each other to put semiconductor devices in the cavities 24. Further, the piston 33 is lowered and the resin tablet 25 heated to 80°-100° C. in advance is placed in the pot 23, whereupon the upper and lower molds 21 and 22 are clamped together.

Then, as shown in FIG. 3, the exhaust valve 29 is moved downward to create a clearance between the exhaust valve 29 and the upper mold section 21. In this state, the vacuum pump 27 is operated to draw off the air contained in the pot 23, and cavities 24 via the exhaust port 26. Thus, a vacuum, for example of 3 Torr, is created in the pot 23 and cavities 24.

In the above-mentioned vacuum state, such gases as are contained in the resin tablet 25 expand. As a result, the resin tablet 25 expands in volume. The shape of the resin tablet expanded to a maximum is shown in the dotted line 36. As described above, the pot 23 has a volume which is greater than the maximum volume to which the heated resin tablet 25 expands in a vacuum. Further, the inner diameter of the pot 23 is about 1.17 times as large as the initial volume of the resin tablet 25. Therefore, even when the resin tablet 25 expands to a maximum, there is no possibility of the resin tablet 25 contacting the inner wall surface of the pot 23. The gas bubbles in the resin tablet 25 are broken, so that almost all gases in the resin tablet 25 are drawn off by the vacuum pump 27.

Upon completion of the drawing-off of the air contained in the pot 23 and cavities 24 and the gases emitted from the resin tablet 25, the exhaust valve 29 is moved upward by the air cylinder 28 until the valve closed state shown in FIG. 4 is established. Thereafter, the piston 33 is pushed upward by the hydraulic cylinder 32 to press the resin tablet 25. Since the resin tablet 25 has its temperature elevated and its viscosity is consequently lowered by heat transfer from the mold 20, the resin is fed to the cavities 24 via the runners 37 by the pressing force produced by the piston 33. In this manner, the semiconductor devices placed in the cavities 24 are completely enclosed in the resin.

The resin in the cavities 24 will be cured in 2-3 minutes. Thereafter, the upper and lower mold sections 21 and 22 are separated to take out the resin moldings. Necessary treatments are applied to the removed moldings to complete the products.

In the embodiment described above, the outer diameter of the resin tablet 25 has been 30 mm and the inner diameter of the pot 23 has been 35 mm, the ratio being 1:1.17. With such a ratio, it is possible to maximize the efficiency of use of resin and minimize the loss of resin and to sufficiently discharge the air and gases contained in the pot 23 and resin tablet 25. If the efficiency of use of resin is allowed to be more or less reduced, the ratio of the inner diameter of the pot 23 to the outer diameter of the resin tablet 25 may be more than 1.17. In brief, it is necessary only that the inner diameter of the pot 23 be greater than the maximum outer diameter to which the resin tablet expands in vacuum. In addition, the gases emitted from the resin tablet 25 in a vacuum are air, water vapor, low-boiling organic substances and the like.

In the embodiment shown in FIGS. 3 and 4, the pot 23 and cavities 24 have been evacuated. However, the arrangement may be such that the pot 23 alone is evacuated.

Figure 5:
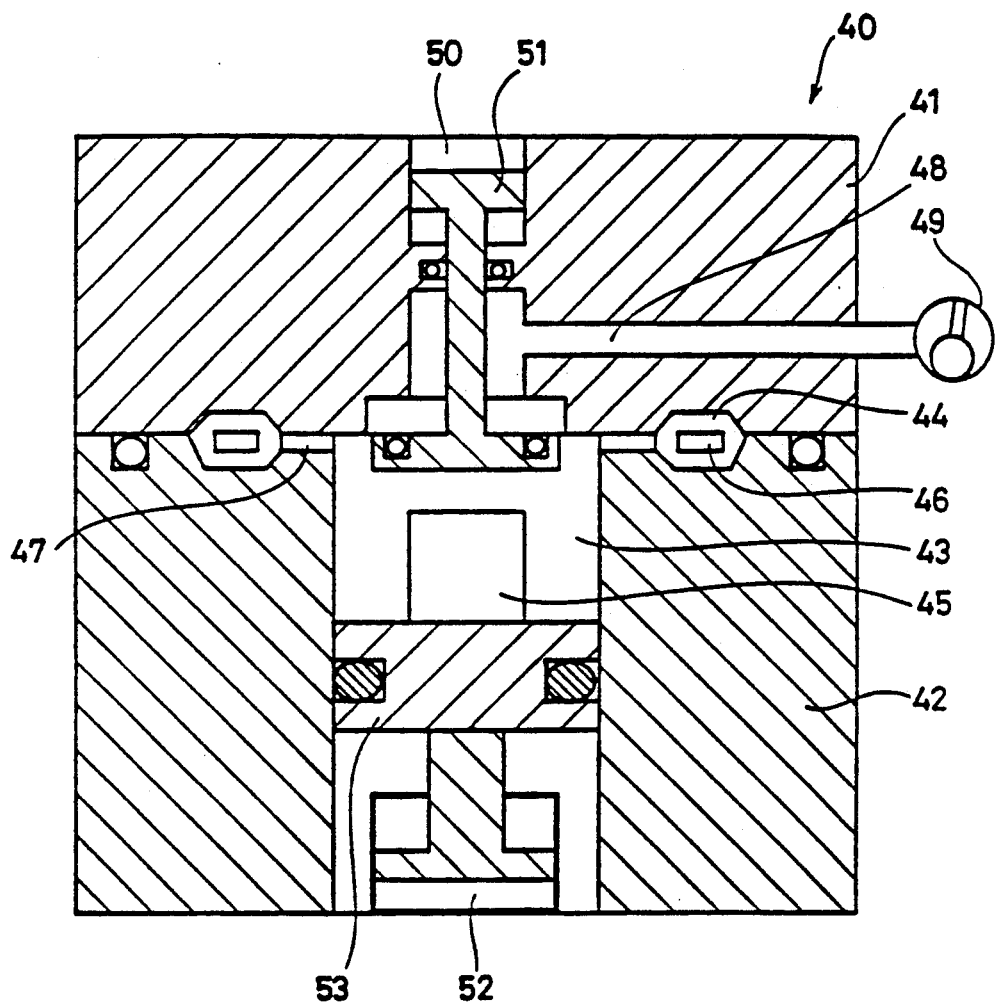
FIG. 5 is a diagrammatic sectional view of another embodiment of an apparatus according to the invention.
Figure 6:
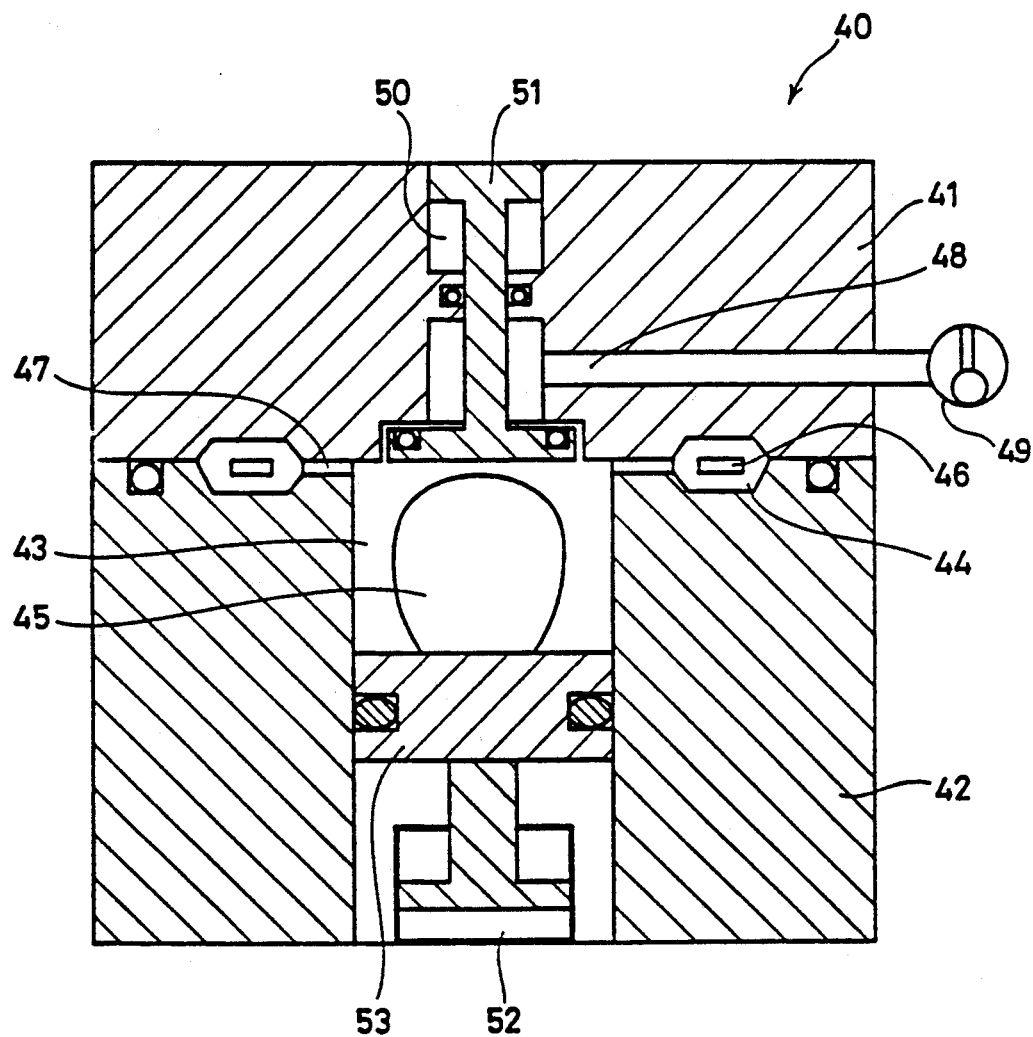
FIG. 6 is a diagrammatic sectional view showing a state established by performing an evacuating operation on the apparatus shown in FIG. 5.
Figure 7:
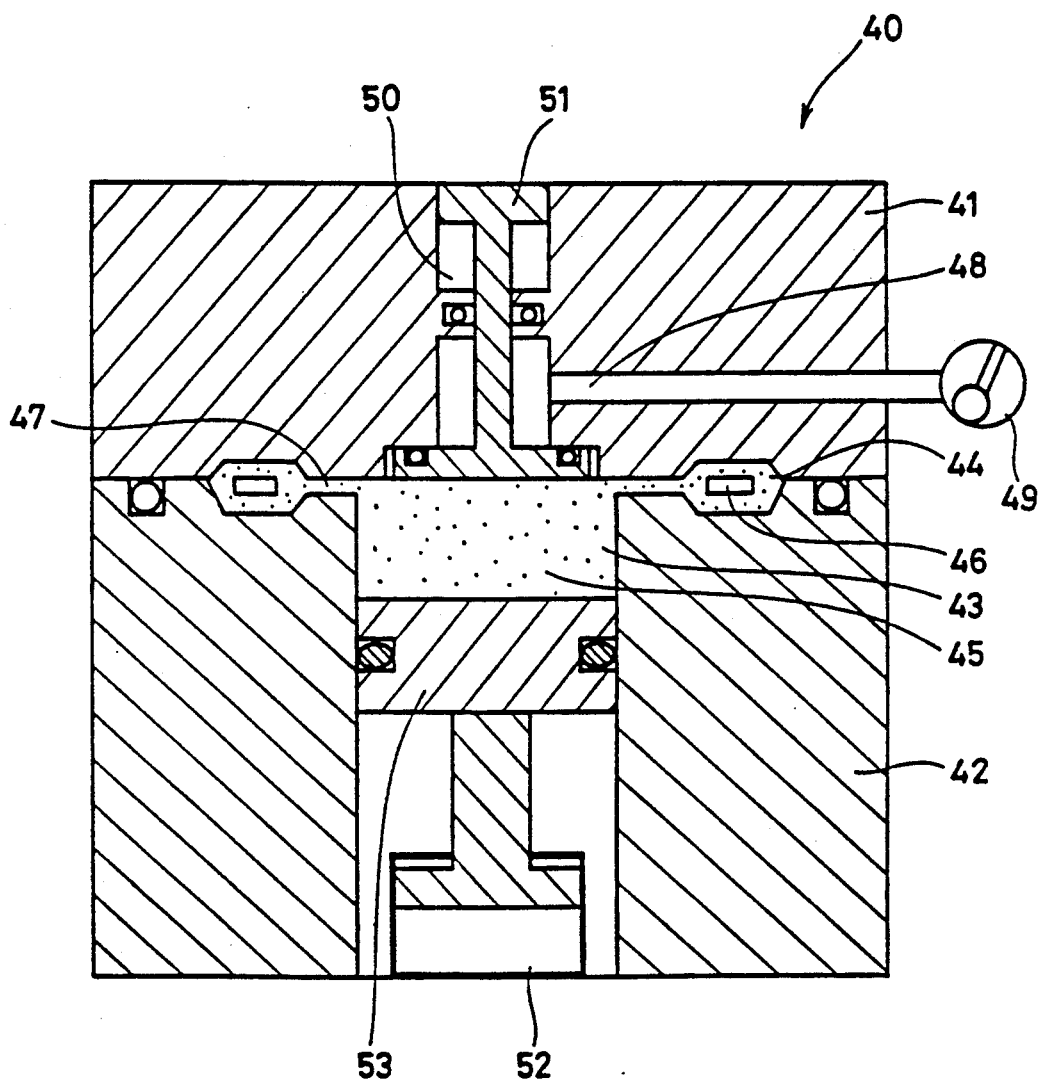
FIG. 7 is a diagrammatic sectional view showing a state established by operating a piston from the state shown in FIG. 6.

FIGS. 5 through 7 show another embodiment of an apparatus according to the invention. As in the first embodiment described above, the illustrated apparatus comprises a mold 40 having an upper mold section 41 and a lower mold section 42 which are separable from each other, a vacuum pump 49 serving as vacuum means, and a piston 53 serving as pressing means. Formed in the region of contact between the upper and lower mold sections 41 and 42 are a pot 43 for receiving a resin tablet 45, and a plurality of cavities 44 communicating with said pot 43 through runners 47 for receiving semiconductor devices 46. The upper mold section 41 is formed with an exhaust port 48 communicating with the pot 43. A vacuum pump 49 serves to draw off the air contained in the pot 43 and the gases emitted from the resin tablet 45 via the exhaust port 48. Further, as shown, the upper mold section 41 is provided with an exhaust valve 51 for opening and closing the exhaust port 48. This exhaust valve 51 is driven by an air cylinder 50. In the state shown in FIG. 5, the exhaust port 48 is opened and in the state shown in FIG. 7 it is closed.

A piston 53 is driven by a hydraulic cylinder 52. The piston 52 presses the resin tablet 45 by reducing the volume of the pot 43 to feed the resin to the cavities 44 via the runners 47.

The pot 43 has a volume which is greater than the maximum volume to which the heated resin tablet 45 expands in a vacuum. The resin tablet 45 expands in a vacuum to about twice its initial volume. Low-boiling substances are contained in the resin tablet 45. Since these low-boiling substances, when put in a vacuum, decrease in boiling point, they vaporize. These vapors and the air in the resin tablet 45 expand owing to the pressure difference, with the result that the resin tablet 45 itself expands to about twice its initial volume. Thus, in the embodiment shown in FIGS. 5 through 7, the pot 43 has a volume which is more than twice as large as the volume of the resin tablet 45. If the pot 43 had a volume which is less than the mentioned value, the expanded resin tablet 45 would fill up the space in the pot 43, and further expansion of the resin tablet 45 would be prevented.

The upper and lower mold sections 41 and 42, which have been heated to about 180° C. by suitable heating means, are opened and semiconductor devices 46 are placed in the cavities 44. The hydraulic cylinder 52 is then operated to lower the piston 53 and a resin tablet 45 is placed on the piston 53. The resin tablet 45 has been heated in advance to 80°-100° C. The upper and lower mold sections 41 and 42 are then clamped together. Thereafter, the exhaust valve 51 is lowered and the vacuum pump 49 is operated to draw off the air contained in the pot 43 and cavities 44. In this manner, a vacuum of about 3 Torr is created in the pot 43.

When a vacuum is created in the pot 43 as described above, the resin tablet 45 expands to about twice its initial volume, as shown in FIG. 6.

When the resin tablet 45 expands to a maximum, the gas bubbles in the resin tablet 45 are broken. Thus, the gases emitted from the resin tablet 45 are completely drawn off. Upon completion of the drawing-off of the air contained in the pot 43 and the gases emitted from the resin tablet 45, the exhaust valve 51 is moved upward to close the exhaust port 48 by the air cylinder 50. In this state, the hydraulic cylinder 52 is driven to move the piston 53 upward. The resin tablet 45 is pressed by the piston 53, with the result that the resin is fed to the cavities 44 through the runners 47. Thus, the semiconductor devices 46 disposed in the cavities 44 are completely enclosed in the resin. This state is, shown in FIG. 7.

After the resin has set, the upper and lower mold sections 41 and 42 are separated to take out the moldings. And necessary treatments are applied to the moldings thus taken out to finish the products.

Various experiments were performed to see the effects of the invention. The experimental results are described below.

EXPERIMENT 1

Resin-molded semiconductor devices were produced by using the apparatus shown in FIG. 5. Further, for comparison purposes, other resin-molded semiconductor devices were also produced by using an apparatus shown in FIG. 9.

Figure 9:
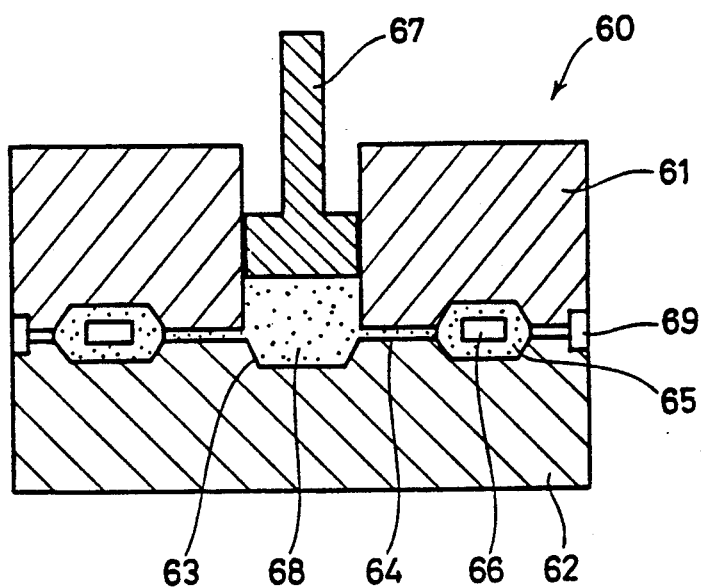
FIG. 9 is a diagrammatic sectional view showing a mold which has heretofore been in common use.

The apparatus diagrammatically shown in FIG. 9 has heretofore been in common use. This apparatus comprises a mold 60 having an upper mold section 61 and a lower mold section 62 which are separable from each other, and a pressing plunger 67. The mold 60 is formed with a pot 63 for receiving a resin tablet, and a plurality of cavities 65 communicating with said pot 63 through runners 64. A semiconductor device 66 is placed in each cavity 65. The pressing plunger 67 presses the resin tablet, thereby feeding the resin 68 to the cavities 65 via the runners 64. Further, the mold 60 is provided with an exhaust port 69 for drawing off the air contained in the pot 63 and cavities 65.

Samples were prepared by using the apparatus shown in FIGS. 5 and 9 under the conditions shown in Table 1 below.

TABLE 1

| | Mold Construction | |
|---|---|---|
| Item | Mold shown in FIG. 5 | Mold shown in FIG. 9 |
| Molding temperature (°C.) | 175 | 175 |
| Molding pressure (kg/cm²) | 100 | 100 |
| Molding time (minutes) | 3 | 3 |
| Resin injection time (seconds) | 15 | 14 |
| Pot configuration (mm) | φ37 × 100 | φ37 × 50 |
| Number of molding (pcs.) | 28 | 28 |
| Degree of vacuum (Torr) | 3 | 3 |
| Evacuation time (seconds) | 10 | 5 |
| Resin tablet configuration (mm) | φ35 × 40 | φ35 × 40 |
| Type of resin used | EME 5000 eposy resin produced by Sumitomo Bakelite Co., Ltd. | EM 5000 epoxy resin produced by Sumitomo Bakelite Co., Ltd. |

The amount of gas bubbles contained in the moldings produced under the conditions shown above was examined. The result is shown in Table 2 below.

TABLE 2

| Type of sample | Mold construction | Evacuating operation on mold | Number of gas bubbles (pcs.) |
|---|---|---|---|
| Sample A | Mold shown in FIG. 5 | Yes | 0 |
| Sample B | Mold shown in FIG. 9 | Yes | 150 |
| Sample C | Mold shown in FIG. 9 | No | 153 |

In Table 2, the sample A was one prepared by using the apparatus shown in FIG. 5. The sample B was one prepared by using the apparatus shown in FIG. 9; the air contained in the pot 68 and cavities 65 was drawn off prior to molding operation. The sample C was one prepared by using the apparatus shown in FIG. 9; the air contained in the pot 63 and cavities 65 was not drawn off. As can be seen in Table 2, between the samples B and C there is not much difference in the number of gas bubbles observed. In other words, it is seen that simply drawing off the air contained in the pot 63 and cavities 65 allows large number of gas bubbles to remain in the moldings. On the contrary, the sample A prepared by using the apparatus shown in FIG. 5 contains no gas bubbles whatsoever. This indicates that increasing the volume of the pot 43 and drawing off the air emitted from the resin tablet 45 ensures the absence of gas bubbles in the moldings obtained.

Experiment 2

Figure 8:
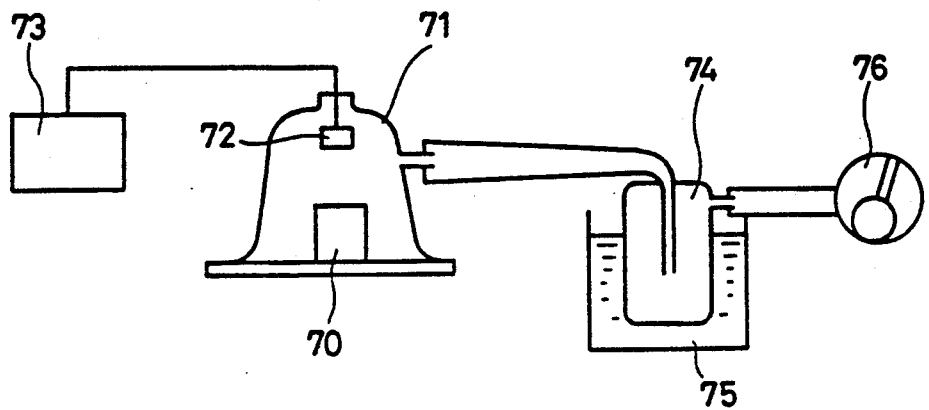
FIG. 8 is a diagrammatic view of an apparatus used for trapping low-boiling substances contained in resin.

A test was conducted as to how much low-boiling substance was evaporated from the resin tablet placed in a vacuum. For this test, use was made of a system shown in FIG. 8. In this system, a resin tablet 70 is placed in a vacuum container 71. A vacuum pump 76 is operated to increase the degree of vacuum in the vacuum container 71. The degree of vacuum in the vacuum container 71 is measured by using a Pirani gauge 72 and vacuum gauge 73. The low-boiling substances evaporated from the resin tablet 70 are trapped in a trap 74. To facilitate this trapping, liquid hydrogen 75 is used to cool the trap 74.

As the resin tablet 70, epoxy resin (EME 5000) produced by Sumitomo Bakelite Co., Ltd. was used. This resin tablet 70, weighing 1 kg, was heated to 80°–100° C. before it was put in the vacuum container 71. An evacuating operation was performed by the vacuum pump 76 for 10 minutes, creating a vacuum of 1 Torr in the vacuum container 71. During this operation, the low-boiling substances were analyzed for their amounts and components Gravimetric analysis was used for the measurement of amounts and for the analysis of components use was made of hydrogen ion exponent, infrared spectroscopic analysis and gas chromatography. The result is shown in Table 3.

TABLE 3

| Trapped substance | Hydrogen ion exponent | Trapped amount |
|---|---|---|
| Water | 4.4 | 5 cc |
| Phenol-containing substance | — | 0.01 g |
| Epoxy-containing substance | — | 0.01 g |
| Amine-containing substance | — | 0.1 mg |
| Silane-containing substance | — | 0.1 mg |

As is clear from Table 3, it is seen that almost all organic substances in the raw material of the resin tablet 70 are trapped.

EXPERIMENT 3

Samples were prepared by using the apparatus shown in FIG. 5. These samples are called the samples D. Prior to preparation, the air contained in the pot 43 was drawn off and so were the gases emitted from the resin tablet 45. The time required for this drawing off was 10 seconds, and the degree of vacuum in the pot 43 was 0.2 Torr. For comparison purposes, by using the apparatus shown in FIG. 9, other samples were prepared without drawing off the air contained in the pot 63 and cavities 65. These samples are called the samples E. The conditions for preparing the samples D and E were as follows.

Molding temperature: 180° C.
Molding time 90 seconds
Molding pressure 100 kg/cm²
After-cure 16 hours at 170° C.
Number of samples prepared: 100 each for the samples D and E Material: Epoxy resin EME 5000 produced by Sumitomo Bakelite Co., Ltd.

Semiconductor devices (integrated circuits): produced by Mitsubishi Denki Kabushiki Kaisha The samples D and E were tested first for their moisture resistance. This moisture resistance test was made with the samples maintained in an atmosphere at 121° C. and 2 atmospheric pressures for 1,000 hours. The percent defective found by this test is as follows.

Sample D: 3%
Sample E: 80%

Further, a high temperature retention test was conducted. This high temperature retention test was made by maintaining the samples in an atmosphere at 170° C. for 1,000 hours. The percent defective found by this test is as follows.

Sample D: 2%
Sample E: 30%

As is clear from the above results, it is seen that the samples prepared by using the apparatus shown in FIG. 5 are superior in moisture resistance and in high temperature retention capability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for packaging semiconductor devices in resin by using a mold having a pot with inner sidewalls, and a plurality of cavities communicating with said pot through runners, comprising the steps of:
   placing semiconductor devices in said cavities;
   placing a resin tablet in said pot;
   creating a vacuum in said pot and heating said resin tablet in said pot under said vacuum to expand said resin tablet to a volume about twice its original unheated volume sufficient to enable removal of substantially all gases evolved from the resin tablet without contacting the tablet to the inner sidewalls of said pot, said vacuum drawing off substantially all air contained in said pot and substantially all gases emitted from said heated resin tablet;
   then pressing said resin tablet in said pot, to thereby feed the heated resin from said pot to said cavities via said runners to enclose said semiconductor devices therein; and
   allowing the heated resin enclosing said semiconductor devices to be cured.

2. A method as set forth in claim 1, wherein:
said pot has a volume which is more than twice as large as an initial volume of said resin tablet before heating thereof under vacuum.

3. A method as set forth in claim 1, wherein:
said pot has an inner diameter which is more than 1.17 times as large as an outer diameter of said resin tablet before heating thereof under vacuum.

4. A method as set forth in claim 1, wherein:
the gases emitted from said resin tablet comprise air.

5. A method as set forth in claim 1, wherein:
the gases emitted from said resin tablet comprise water.

6. A method as set forth in claim 1, wherein:
the gases emitted from said resin table comprise a low-boiling organic substance.

7. A method according to claim 1, wherein:
said vacuum has a degree of between 0.2 and three Torr.

8. A method for packaging semiconductor devices in resin by using a two-part mold having a pot with inner sidewalls, and a plurality of cavities communicating with said pot through runners, comprising the steps of:
   heating said two-part mold to a predetermined first temperature;
   separating said two parts of said heated mold, and placing semiconductor device in said cavities and a resin table in said pot of said heated mold and clamping said two parts of said mold together;
   applying a vacuum to said pot and said resin table placed therein, whereby said resin tablet expands to a volume about twice its original unheated volume sufficient to enable removal of substantially all gases evolved from the resin table without contacting the tablet to the inner sidewalls of said pot, said vacuum drawing off substantially all air contained in said pot and substantially all gases emitted from said resin tablet;
   then pressing said resin tablet in said pot, to thereby feed the heated resin from said pot to said cavities via said runners to enclose said semiconductor devices therein; and
   curing the heated resin enclosing said semiconductor devices.

9. A method according to claim 8, comprising the further step of:
preheating said resin tablet to a predetermined second temperature before placement thereof in said mold.

10. A method according to claim 8, wherein said predetermined first temperature is at least 180° C.

11. A method according to claim 10, wherein:
said predetermined second temperature is in the range 80°–100° C.

12. A method according to claim 8, wherein:
said vacuum has a degree of between 0.2 and three Torr.

* * * * *